(12) United States Patent
Fan et al.

(10) Patent No.: US 8,045,343 B2
(45) Date of Patent: Oct. 25, 2011

(54) SERVER CARRIER ASSEMBLY

(75) Inventors: Chen-Lu Fan, Taipei Hsien (TW);
Li-Ping Chen, Taipei Hsien (TW);
Yi-Lung Chou, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 340 days.

(21) Appl. No.: 12/464,509

(22) Filed: May 12, 2009

(65) Prior Publication Data
US 2010/0039007 A1 Feb. 18, 2010

(30) Foreign Application Priority Data

Aug. 15, 2008 (CN) .................... 2008 2 0301840 U

(51) Int. Cl.
*H02B 1/20* (2006.01)
(52) U.S. Cl. .................. 361/826; 361/825; 361/810
(58) Field of Classification Search .................. 361/825, 361/826, 727, 679, 756, 689, 807, 810
See application file for complete search history.

(56) References Cited

U.S. PATENT DOCUMENTS

| | | | |
|---|---|---|---|
| 6,600,665 B2 * | 7/2003 | Lauchner | 361/826 |
| 6,896,344 B2 * | 5/2005 | Tsutsumi et al. | 312/330.1 |
| 6,972,949 B1 * | 12/2005 | Helgenberg et al. | 361/679.02 |
| 7,023,708 B2 * | 4/2006 | Nguyen et al. | 361/810 |
| 7,473,846 B2 * | 1/2009 | Doerr et al. | 174/69 |
| 2011/0053485 A1 * | 3/2011 | Huang et al. | 454/184 |

* cited by examiner

*Primary Examiner* — Hung S Bui
(74) *Attorney, Agent, or Firm* — Altis Law Group, Inc.

(57) ABSTRACT

A server carrier assembly includes a server carrier configured for receiving a server therein, and a cable collecting structure mounted to the server carrier. The cable collecting structure includes a bracket and at least one receiving portion extending from the bracket. A space between the bracket and the receiving portion is defined for collecting at least one cable of the server. At least one opening is defined in the bracket and configured for the cable of the server to extend there through.

19 Claims, 3 Drawing Sheets

SERVER CARRIER ASSEMBLY

BACKGROUND

1. Technical Field

The present disclosure relates to a server carrier assembly.

2. Description of Related Art

A server carrier installed on a base is usually used for receiving a computer server therein. A computer server often includes a plurality of cables arranged along any convenient pathway for connecting to other devices outside the server, which can be disorderly, and will affect the server carrier sliding in the base when the server carrier is installed on the base.

What is needed, therefore, is a server carrier assembly capable of keeping cables of a server orderly.

DETAILED DESCRIPTION

Figure 1:
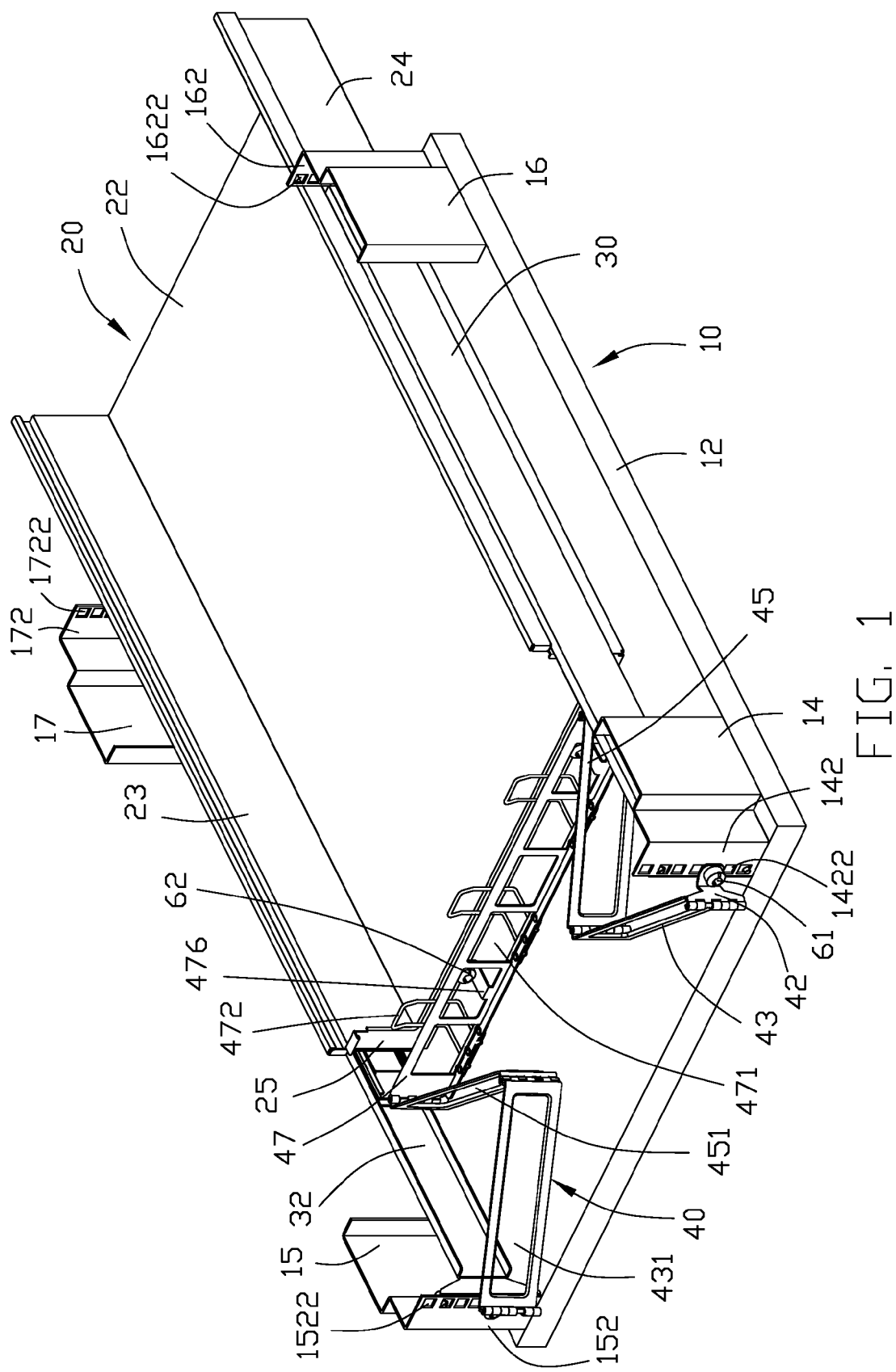
FIG. 1 is an assembled isometric view of an embodiment of a server carrier assembly.

Referring to FIG. 1, an embodiment of a server carrier assembly includes a base 10, a server carrier 20 for carrying a computer server (not shown), and a cable collecting structure 40 connecting the base 10 to the server carrier 20. The server carrier 20 is mounted in the base 10 through two rails 30, 32. The server carrier 20 may be slid into and out of the base 10 to install and later remove the server for servicing.

The base 10 includes a bottom panel 12, and four mounting racks 14, 15, 16, 17 correspondingly disposed on four corners of the bottom panel 12. Each mounting rack 14, 15, 16, 17 includes a mounting piece 142, 152, 162, 172 perpendicular to the bottom panel 12, and the mounting pieces 142, 152, 162, 172 are parallel to each other. A plurality of assembly holes 1422, 1522, 1622, 1722 are correspondingly defined in each mounting piece 142, 152, 162, 172.

With the use of screws or the like, the rail 30 is mounted on the mounting racks 14, 16 and the rail 32 is mounted on the mounting racks 15, 17. The two rails 30, 32 are symmetrically opposite to each other.

The server carrier 20 includes a bottom wall 22, two sidewalls 23, 24 extending substantially perpendicularly from opposite edges of the bottom wall 22, and a rear wall 25 perpendicular to the bottom wall 22 and the sidewalls 23, 24. The two sidewalls 23, 24 of the server carrier 20 are correspondingly installed to the inner sides of the two rails 30, 32. The server carrier 20 is capable of sliding relative to the base 10 along a direction parallel to the bottom panel 12 of the base 10 along the two rails 30, 32. Two mounting holes (not shown) are defined in the rear wall 25.

Figure 2:
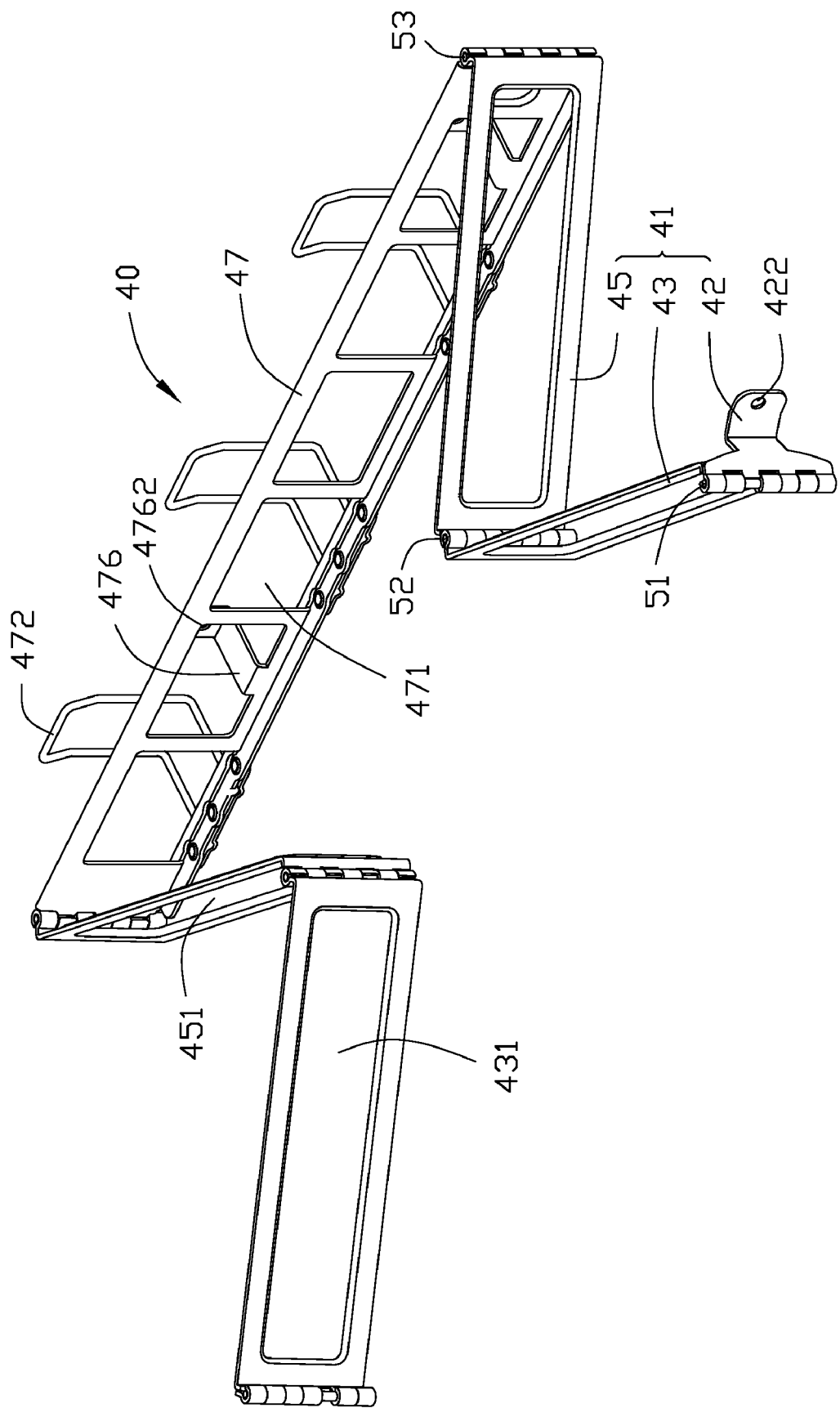
FIG. 2 is an isometric view of a cable collecting structure of FIG. 1.

Referring to FIG. 2, the cable collecting structure 40 includes two arms 41 and a bracket 47. The two arms 41 are correspondingly pivotably connected to two opposite sides of the bracket 47 through two pivots 53. Each arm 41 includes a fixing piece 42, a first connecting member 43, and a second connecting member 45. A fixing hole 422 is defined in each fixing piece 42, and each fixing piece 42 is pivotably connected to the corresponding first connecting member 43 through a pivot 51. Each first connecting member 43 is pivotably connected to the corresponding second connecting member 45 through a pivot 52. A plurality of receiving portions 472 for receiving and collecting cables (not shown) of the server and bending pieces 476 extend perpendicularly from a bottom edge of the bracket 47. A plurality of rectangular first openings 471 is defined in the bracket 47, a second opening 431 is defined in each first connecting member 43, a third opening 451 is defined in each second connecting member 45 for the cables extending through to communicate with other devices outside the server. In the present embodiment, the number of the receiving portions 472 is three, and the number of the bending pieces 476 is two. Each receiving portion 472 is substantially L-shaped. The distance between a top edge of the bracket 47 and a free end of each receiving portion 472 can be substantially the same as a distance between the bracket 47 and the rear wall 25. The distance between the top edge of the bracket 47 and the free end of each receiving portion 472 can be substantially the same as an extended length of each bending piece 476. Therefore a space is defined between the bracket 47 and the server carrier 20 for collecting cables of the server. A locking hole 4762 is defined in each bending piece 476 corresponding to the mounting hole of the rear wall 25 of the server carrier 20.

Figure 3:
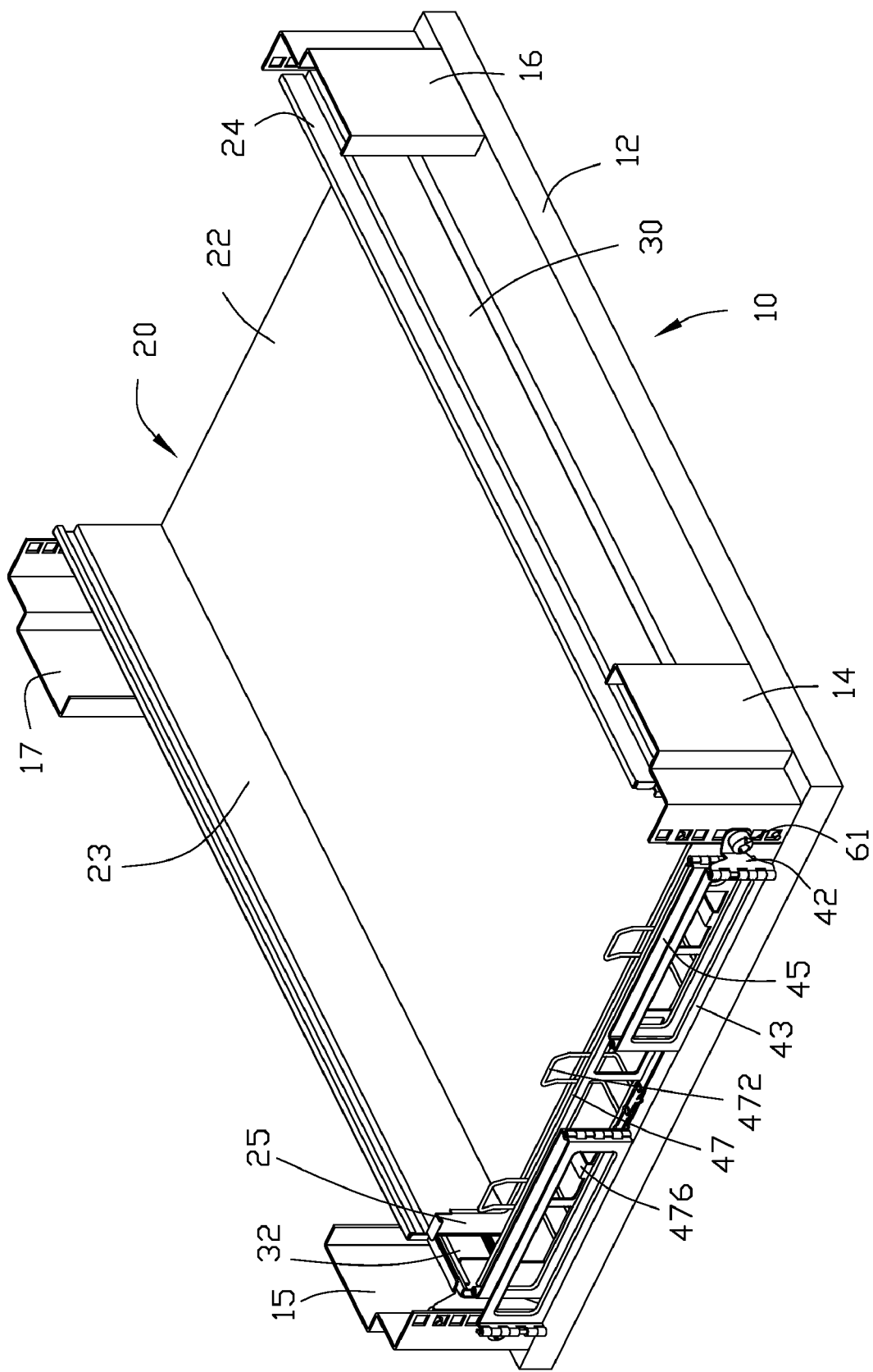
FIG. 3 is an assembled isometric view in another state of FIG. 1.

Referring to FIG. 1 to FIG. 3, in assembly, two screws 61 are correspondingly screwed in the fixing holes 422 of the cable collecting structure 40 and the corresponding assembly holes 1422, 1522 of the base 10 to mount the cable collecting structure 40 on the base 10. The server carrier 20 is installed between the two rails 30, 32, the locking holes 4762 of the cable collecting structure 40 align with the corresponding mounting holes of the rear wall 25 of the server carrier 20. Two screws 62 are correspondingly screwed in the locking holes 4762 of the cable collecting structure 40 and the corresponding mounting holes of the rear wall 25 of the server carrier 20 to mount the bending pieces 476 to the rear wall 25 of the server carrier 20. Therefore, the cable collecting structure 40, the base 10, and the server carrier 20 are secured together.

In use, the cables of the server in the server carrier 20 are orderly arranged in the receiving portions 472 and extend through the openings 471, 451, 431 of the bracket 47. The server carrier 20 slides in the base 10 along the direction parallel to the bottom panel 12 of the base 10 to drive the bracket 47 of the cable collecting structure 40 move together with the server carrier 20. At the same time, the first connecting members 43 and the second connecting members 45 of the two arms 41 rotate about the pivots 51, 52, 53 correspondingly. Referring to FIG. 3, when the server carrier 20 fully slid into the base 10, the first connecting members 43 will be parallel to the second connecting members 45 and the bracket 47. The cables in the receiving portions 472 can move along with the cable collecting structure 40. Therefore, when the server carrier 20 slides in the base 10, the cables of the servers will stay collected together and not affect the sliding of the server carrier 20.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server carrier assembly, comprising:
a server carrier configured for receiving a server therein;

a cable collecting structure mounted to the server carrier, the cable collecting structure comprising a bracket and at least one receiving portion extending from the bracket, a space between the bracket and the receiving portion capable of collecting at least one cable of the server, and at least one opening being defined in the bracket; and a base configured for receiving the server carrier, the cable collecting structure further comprising two arms, one side of each arm being pivotably connected of the bracket, the other side of each arm being pivotably connected to the base.

2. The server carrier assembly of claim 1, wherein the at least one receiving portion extends from a bottom edge of the bracket and is substantially an L-shape.

3. The server carrier assembly of claim 2, wherein the bracket is mounted to a rear wall of the server carrier, and a distance between a top edge of the bracket and a free end of the receiving portion is substantially the same as a distance between the bracket and the rear wall.

4. The server carrier assembly of claim 1, wherein each arm comprises a fixing piece, a first connecting member and a second connecting member; the fixing piece is mounted on the base and pivotably connected to the first connecting member, the second connecting member is pivotably connected to the first connecting member and the bracket.

5. The server carrier assembly of claim 4, wherein the fixing piece is pivotably connected to the first connecting member through a first pivot, the first connecting member is pivotably connected to the second connecting member through a second pivot, and the second connecting member is pivotably connected to the bracket through a third pivot, and the three pivots are parallel to each other.

6. The server carrier assembly of claim 1, wherein at least one bending piece extends perpendicularly from the bracket, and a locking hole being defined in the bending piece corresponds to a mounting hole.

7. A server carrier assembly, comprising:
a base;
a server carrier slideably mounted to the base and configured for receiving a server therein; and
a cable collecting structure configured for collecting a cable of the server in the server carrier, the cable collecting structure comprising a bracket and two arms pivotably connected to opposite sides of the bracket; the bracket being mounted to the server carrier, the two arms being pivotably mounted to the base, a space being defined between the bracket and the server carrier capable of receiving the cable, a first opening being defined in the bracket and a second opening being defined in each arm;
wherein the server carrier is slidable in the base and will drive the cable collecting structure to move relative to the base and cause movement of the two arms.

8. The server carrier assembly of claim 7, wherein at least one receiving portion extends from a bottom edge of the bracket, the space is at least partly defined by the receiving portion, the receiving portion is substantially an L-shaped.

9. The server carrier assembly of claim 8, wherein the bracket is mounted to a rear wall of the server carrier, and a distance between a top edge of the bracket and a free end of the receiving portion is substantially the same as a distance between the bracket and the rear wall.

10. The server carrier assembly of claim 9, wherein each arm comprises a fixing piece, a first connecting member and a second connecting member; the fixing piece is mounted on the base and pivotably connected to the first connecting member, the second connecting member is pivotably connected to the first connecting member and the bracket, the second opening being defined in each first connecting member, and a third opening being defined in each second connecting member.

11. The server carrier assembly of claim 10, wherein the fixing piece is pivotably connected to the first connecting member through a first pivot, the first connecting member is pivotably connected to the second connecting member through a second pivot, and the second connecting member is pivotably connected to the bracket through a third pivot, and the three pivots are parallel to each other.

12. The server carrier assembly of claim 11, wherein the base comprises a bottom panel and four mounting racks perpendicularly disposed near four corners of the bottom panel, two parallel rails being mounted on the mounting racks, the two sidewalls of the server carrier being mounted to the two rails correspondingly, and the server carrier is slidable in the base.

13. The server carrier assembly of claim 12, wherein the three pivots of the cable collecting structure are perpendicular to the bottom wall of the base.

14. A server carrier assembly, comprising:
a server carrier configured for receiving a server therein;
a cable collecting structure mounted to the server carrier, the cable collecting structure comprising a bracket and an arm connected to the bracket, the arm comprising a first connecting member, and a second connecting member pivotably mounted to the first connecting member, the arm being foldable at one side of the bracket;
wherein a first opening defined in the bracket, a second opening defined in the first connecting member, a third opening defined in the second connecting member, and the first opening, the second opening, and the third opening are substantially overlapped and are adapted to communicate for guiding cables extending therethrough at a folded state of the arm.

15. The server carrier assembly of claim 14, wherein at least one receiving portion is located on the bracket and is opposite to the arm.

16. The server carrier assembly of claim 15, wherein the at least one receiving portion extends from a bottom edge of the bracket and is substantially an L-shape.

17. The server carrier assembly of claim 16, wherein the bracket is mounted to a rear wall of the server carrier, and a distance between a top edge of the bracket and a free end of each of the at least one receiving portion is substantially the same as a distance between the bracket and the rear wall.

18. The server carrier assembly of claim 14 further comprising a base, wherein the server carrier is located in the base, and the arm is connected to the server carrier at a first end and is connected to the base at a second end.

19. The server carrier assembly of claim 18, wherein the first connecting member is connected to the base through a first pivot, the first connecting member is pivotably connected to the second connecting member through a second pivot, and the second connecting member is pivotably connected to the bracket through a third pivot.

* * * * *